(12) United States Patent
Nikkhoo

(10) Patent No.: US 9,791,704 B2
(45) Date of Patent: Oct. 17, 2017

(54) BONDED MULTI-LAYER GRAPHITE HEAT PIPE

(71) Applicant: Microsoft Technology Licensing, LLC, Redmond, WA (US)

(72) Inventor: Michael Nikkhoo, Saratoga, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 27 days.

(21) Appl. No.: 14/600,769

(22) Filed: Jan. 20, 2015

(65) Prior Publication Data

US 2016/0212887 A1    Jul. 21, 2016

(51) Int. Cl.
  *H05K 7/20* (2006.01)
  *G02B 27/01* (2006.01)
  *G06F 1/16* (2006.01)

(52) U.S. Cl.
  CPC ......... *G02B 27/0176* (2013.01); *G06F 1/163* (2013.01); *H05K 7/20418* (2013.01)

(58) Field of Classification Search
  CPC . H05K 7/20; H05K 7/203; H05K 5/00; G06F 1/20; H01L 23/36; H01L 23/3733; H01L 33/641; F28F 1/14; F28F 1/065; F28F 3/00; B32Y 30/00; B32B 9/00
  USPC .... 361/679.46, 679.54, 679.55, 679.52, 704, 361/708, 709, 710; 165/80.2, 80.3, 165/104.33, 185; 428/105, 137, 293, 339, 428/408, 688; 345/8
  See application file for complete search history.

(56) References Cited

U.S. PATENT DOCUMENTS 3,981,427 A * 9/1976 Brookes .................. B23K 1/19
  228/122.1
4,591,659 A * 5/1986 Leibowitz ............... B32B 15/08
  174/256

(Continued)

FOREIGN PATENT DOCUMENTS

CN    1786868 A    6/2006
CN    202322711 U    7/2012

(Continued)

OTHER PUBLICATIONS

Panasonic, "Pyrolytic Graphite Sheet", published Feb. 20, 2013, Available at: http://www.panasonic.com/industrial/includes/pdf/PGS_Brochure.pdf.

(Continued)

*Primary Examiner* — Robert J Hoffberg
(74) *Attorney, Agent, or Firm* — Vierra Magen Marcus LLP

(57) ABSTRACT

A passive heat pipe structure used in a wearable device includes a multilayer stack of graphite sheets, each sheet having a plane high thermal conductivity oriented along a first axis and a plane of lower thermal conductivity along a second axis different from the first axis. The stack has a three-dimensional shape including a length and a width where the length is longer than the width and the first axis aligns parallel to said length, the multilayer stack having a height less than the width. A plurality of bonding layers interspersed between each sheet of the multilayer stack, each bonding layer thermally coupling each sheet to a respective adjacent sheet. The bonding layers may comprise metal layers or adhesive layers.

12 Claims, 9 Drawing Sheets

(56) References Cited

U.S. PATENT DOCUMENTS

| | | | |
|---|---|---|---|
| 4,689,110 A * | 8/1987 | Leibowitz | B32B 15/08 156/253 |
| 4,849,858 A * | 7/1989 | Grapes | H05K 1/0203 165/185 |
| 5,175,975 A | 1/1993 | Benson et al. | |
| 5,715,337 A | 2/1998 | Spitzer et al. | |
| 5,739,893 A * | 4/1998 | Karasawa | G09B 9/307 351/158 |
| 6,060,166 A * | 5/2000 | Hoover | B29C 70/546 165/82 |
| 6,075,701 A | 6/2000 | Ali et al. | |
| 6,257,328 B1 * | 7/2001 | Fujiwara | F28F 13/00 165/185 |
| 6,304,459 B1 | 10/2001 | Toyosato et al. | |
| 6,407,922 B1 | 6/2002 | Eckblad et al. | |
| 6,542,359 B2 | 4/2003 | Babcock et al. | |
| 6,661,317 B2 | 12/2003 | Ali et al. | |
| 6,771,502 B2 | 8/2004 | Getz et al. | |
| 6,777,086 B2 * | 8/2004 | Norley | B32B 9/00 257/E23.11 |
| 6,849,849 B1 | 2/2005 | Warner et al. | |
| 6,965,513 B2 | 11/2005 | Montgomery et al. | |
| 7,252,795 B2 * | 8/2007 | Ozaki | B82Y 30/00 257/E23.112 |
| 7,297,399 B2 * | 11/2007 | Zhang | F28F 13/00 361/704 |
| 7,402,340 B2 * | 7/2008 | Ozaki | B82Y 30/00 257/E23.112 |
| 7,745,928 B2 * | 6/2010 | Hasegawa | H01L 23/373 156/253 |
| 7,792,552 B2 | 9/2010 | Thomas et al. | |
| 7,797,808 B2 | 9/2010 | Zhang et al. | |
| 7,799,428 B2 | 9/2010 | Fujiwara et al. | |
| 8,058,802 B2 | 11/2011 | Li et al. | |
| 8,171,979 B2 | 5/2012 | Arai et al. | |
| 8,475,923 B2 | 7/2013 | Katayama et al. | |
| 8,482,188 B1 | 7/2013 | Ma | |
| 8,563,104 B1 | 10/2013 | Rappoport et al. | |
| 8,587,945 B1 | 11/2013 | Hartmann et al. | |
| 8,593,374 B2 | 11/2013 | Kato et al. | |
| 8,673,446 B2 | 3/2014 | Tamaoki et al. | |
| 8,884,984 B2 * | 11/2014 | Flaks | G02B 27/017 345/419 |
| 9,179,579 B2 * | 11/2015 | Hada | H01L 23/373 |
| 9,366,862 B2 | 6/2016 | Haddick et al. | |
| 9,529,396 B2 * | 12/2016 | Shen | G06F 1/203 |
| 9,545,030 B2 * | 1/2017 | Nikkhoo | H05K 7/20127 |
| 9,639,120 B2 * | 5/2017 | Wu | G06F 1/1643 |
| 2002/0005819 A1 | 1/2002 | Ronzani et al. | |
| 2002/0166658 A1 * | 11/2002 | Norley | B32B 9/00 165/185 |
| 2002/0176330 A1 | 11/2002 | Ramonowski et al. | |
| 2004/0212776 A1 | 10/2004 | Spitzer et al. | |
| 2005/0018276 A1 | 1/2005 | Kourogi et al. | |
| 2005/0064230 A1 * | 3/2005 | Sayir | B32B 18/00 428/688 |
| 2006/0246276 A1 | 11/2006 | Chung | |
| 2007/0030653 A1 * | 2/2007 | Norley | B32B 9/00 361/704 |
| 2007/0046890 A1 | 3/2007 | Chen et al. | |
| 2007/0053168 A1 | 3/2007 | Sayir et al. | |
| 2007/0062676 A1 | 3/2007 | Yao | |
| 2007/0091611 A1 | 4/2007 | Hwang | |
| 2007/0177239 A1 | 8/2007 | Tanijiri et al. | |
| 2007/0259186 A1 * | 11/2007 | Ozaki | B82Y 30/00 428/408 |
| 2008/0008216 A1 | 1/2008 | Miller et al. | |
| 2008/0019097 A1 * | 1/2008 | Zhang | F28F 13/00 361/704 |
| 2008/0039569 A1 | 2/2008 | Asdal et al. | |
| 2008/0085403 A1 * | 4/2008 | Sayir | C09K 5/14 428/212 |
| 2008/0128067 A1 | 6/2008 | Sayir et al. | |
| 2009/0122256 A1 | 5/2009 | Wu | |
| 2009/0169410 A1 | 7/2009 | Slaton et al. | |
| 2010/0062220 A1 | 3/2010 | Nishikawa | |
| 2010/0079356 A1 | 4/2010 | Hoellwarth | |
| 2010/0166978 A1 | 7/2010 | Nieminen | |
| 2010/0326645 A1 * | 12/2010 | Fan | B82Y 30/00 165/185 |
| 2011/0030940 A1 * | 2/2011 | Takeda | H01L 23/373 165/185 |
| 2011/0242746 A1 * | 10/2011 | Hoffman | G06F 1/1613 361/679.02 |
| 2012/0262667 A1 | 10/2012 | Willey | |
| 2012/0263940 A1 | 10/2012 | Arzberger et al. | |
| 2013/0057835 A1 | 3/2013 | Reis et al. | |
| 2013/0072839 A1 | 3/2013 | Cuypers et al. | |
| 2013/0162071 A1 | 6/2013 | Chamberlin et al. | |
| 2013/0192813 A1 * | 8/2013 | Yoon | F28F 21/02 165/185 |
| 2013/0235529 A1 | 9/2013 | Yang | |
| 2013/0260081 A1 | 10/2013 | Rappoport et al. | |
| 2013/0293448 A1 * | 11/2013 | Jannard | G02C 11/06 345/8 |
| 2014/0049984 A1 | 2/2014 | Chen et al. | |
| 2014/0120399 A1 | 5/2014 | Balandin | |
| 2014/0138372 A1 | 5/2014 | Ogura | |
| 2014/0178635 A1 | 6/2014 | Imaizumi et al. | |
| 2014/0211322 A1 | 7/2014 | Bohn et al. | |
| 2014/0230868 A1 | 8/2014 | Ryu et al. | |
| 2014/0253866 A1 | 9/2014 | Carabajal | |
| 2015/0029661 A1 | 1/2015 | Huang et al. | |
| 2015/0031301 A1 | 1/2015 | Holman et al. | |
| 2015/0037781 A1 | 2/2015 | Breed et al. | |
| 2015/0090434 A1 * | 4/2015 | Lemak | H01L 23/3733 165/185 |
| 2015/0092351 A1 | 4/2015 | Chowdhury et al. | |
| 2015/0370320 A1 | 12/2015 | Connor | |
| 2016/0041395 A1 | 2/2016 | Yajima | |
| 2016/0053155 A1 | 2/2016 | Lee et al. | |
| 2016/0081226 A1 | 3/2016 | Chiang | |
| 2016/0154442 A1 | 6/2016 | Shen | |
| 2016/0185074 A1 | 6/2016 | Kagawa | |
| 2016/0209659 A1 | 7/2016 | Nikkhoo et al. | |
| 2016/0209660 A1 | 7/2016 | Nikkhoo et al. | |
| 2016/0209661 A1 | 7/2016 | Nikkhoo et al. | |
| 2016/0212879 A1 * | 7/2016 | Nikkhoo | H05K 7/20127 |
| 2016/0212886 A1 | 7/2016 | Nikkhoo et al. | |
| 2016/0212888 A1 * | 7/2016 | Nikkhoo | H05K 7/20963 |
| 2016/0212889 A1 | 7/2016 | Nikkhoo et al. | |
| 2016/0268760 A1 | 9/2016 | Sorokina | |
| 2016/0381832 A1 | 12/2016 | Hurbi et al. | |
| 2017/0067701 A1 * | 3/2017 | Sun | F28F 21/02 |

FOREIGN PATENT DOCUMENTS

| | | |
|---|---|---|
| EP | 0675382 | 4/1995 |
| EP | 675382 A1 | 10/1995 |
| EP | 2034520 A1 | 3/2009 |
| EP | 2327542 | 6/2011 |
| JP | 2009099878 A | 5/2009 |
| JP | 2016039520 | 3/2016 |
| WO | 2005006403 A2 | 1/2005 |
| WO | 2009142447 A1 | 11/2009 |
| WO | 2013020106 A1 | 2/2013 |

OTHER PUBLICATIONS

Panasonic, "Thermal Management Solutions", Published on: Oct. 2013 Available at: https://industrial.panasonic.com/ww/i_e/00000/id_thermalsolution_e/id_thermalsolution_e.pdf.

"Panasonic Pyrolytic Graphite Sheets", Retrieved on: Apr. 2, 2014 Available at: https://www.digikey.com/us/en/ph/panasonic/pgs.html?WT.srch=1&WT.medium=cpc&WT.mc_id=IQ62027418-VQ2-g-VQ6-30457845904-VQ15-1o1-VQ16-c.

Weissler, Paul, "Panasonic enters market with reduced-size heads-up display", Published on: Jan. 14, 2014 Available at: http://articles.sae.org/12757/.

(56) References Cited

OTHER PUBLICATIONS

Hanada, et al., "Further Studies on Copper Nanocomposite with Dispersed Single-Digit-Nanodiamond Particles", In Proceedings of Diamond and Related Materials, vol. 16, Issue 12, Dec. 2007, 2 pages.
Ni, et al., "Shape Memory Effect and Mechanical Properties of Carbon Nanotube/Shape Memory Polymer Nanocomposites", In Proceedings of Composite Structures, vol. 81, Issue 2, Nov. 2007, 2 pages.
Amon, et al., "Thermal Management and Concurrent System Design of a Wearable Multicomputer", In Proceedings of IEEE Transactions on Components, Packaging, and Manufacturing Technology—Part A, vol. 20, No. 2, Jun. 1997, 10 pages.
Lemak, Richard, "Pyrolytic Graphite Heat Spreader Options for High Performance Embedded Components and Systems", In Proceedings of IMAPS Advanced Technology Workshop on Thermal Management, Sep. 11, 2006, 22 pages.
Balandin, "Thermal Properties of Graphene and Nanostructured Carbon Materials", Jul. 22, 2011, Nature Materials, vol. 10., pp. 569-581.
Shahil et al., "Graphene—Multilayer Graphene Nanocomposites as Highly Efficient Thermal Interface Materials",. Jan. 3, 2012, Nano Letters ACS Publications, pp. 861-867.
Shahil et al., "Thermal Properties of Graphene and Multilayer Graphene: Applications in Thermal Interface Materials", Apr. 12, 2012, Elsevier, pp. 1332-1340.
Dume, "Graphene Boosts Thermal Conductivity of Popular Plastic", Oct. 28, 2014, http://physicsworld.com/cws/article/news/2014/oct/28/graphene-boosts-thermal-conductivity-of-popular-plastic.
Requirement for Restriction/Election dated Jun. 9, 2016 in U.S. Appl. No. 14/601,097.
Response to Requirement for Restriction/Election filed Aug. 5, 2016 in U.S. Appl. No. 14/601,097.
Office Action dated Aug. 23, 2016 in U.S. Appl. No. 14/601,097.
Office Action dated Jul. 1, 2016 in U.S. Appl. No. 14/601,093.
Office Action dated Jun. 23, 2016 in U.S. Appl. No. 14/601,099.
Office Action dated Jun. 15, 2016 in U.S. Appl. No. 14/600,753.
"International Search Report and Written Opinion Issued in PCT Application No. PCT/US2016/012013", dated Apr. 11, 2016, 11 Pages.
"International Search Report and Written Opinion Issued in PCT Application No. PCT/US2016/012007", dated Mar. 29, 2016, 11 Pages.
"International Search Report and Written Opinion Issued in PCT Application No. PCT/US2015/067979", dated Mar. 17, 2016, 11 Pages.
"International Search Report and Written Opinion Issued in PCT Application No. PCT/US2016/013124", dated Apr. 1, 2016, 12 Pages.
"International Search Report and Written Opinion Issued in PCT Application No. PCT/US2015/067978", dated Mar. 22, 2016, 12 Pages.
Response to Written Opinion dated May 12, 2016 in PCT Application No. PCT/US2016/013124, 15 pages.
Response to Written Opinion dated May 12, 2016 in PCT Application No. PCT/US2016/012007, 15 pages.
Restriction Requirement dated Mar. 22, 2016 in U.S. Appl. No. 14/601,099, 7 pages.
Response to Restriction Requirement filed May 23, 2016 in U.S. Appl. No. 14/601,099, 7 pages.
"International Search Report and Written Opinion Issued in PCT Application No. PCT/US2016/012008", dated Apr. 25, 2016, 11 Pages.
Response to Office Action filed Sep. 15, 2016 in U.S. Appl. No. 14/600,753.
Response to Office Action filed Sep. 23, 2016 in U.S. Appl. No. 14/601,099.
Written Opinion of the International Preliminary Examining Authority dated Oct. 20, 2016 in International Patent Application No. PCT/US2015/067979.
Final Office Action dated Oct. 21, 2016 in U.S. Appl. No. 14/600,753.
Machine Translation of JP2016039520 published Mar. 22, 2016.
Final Office Action filed Oct. 21, 2016 in U.S. Appl. No. 14/601,099.
Ebadi-Dehaghani et al., "Thermal Conductivity of Nanoparticles Filled Polymers", Smart Nanoparticles Technology, www.intechopen.com, Apr. 2012.
Office Action dated Nov. 10, 2016 in U.S. Appl. No. 14/601,088.
International Preliminary Report on Patentability dated Nov. 9, 2016 in International Patent Application No. PCT/US2016/012007.
Response to Office Action filed Oct. 3, 2016 in U.S. Appl. No. 14/601,093.
International Preliminary Report on Patentability dated Nov. 8, 2016 in International Patent Application No. PCT/US2016/012013.
Final Office Action dated Jan. 12, 2017 in US. Appl. No. 14/601,093.
Written Opinion of the International Preliminary Examining Authority dated Dec. 12, 2016 in International Patent Application No. PCT/US2016/012008.
English language Abstract for EP2327542 published Jun. 1, 2011.
Response to Office Action filed Jan. 23, 2017 in U.S. Appl. No. 14/601,097.
"International Preliminary Report on Patentability Issued in PCT Application No. PCT/US2016/013124", dated Dec. 16, 2016, 6 Pages.
Response to Final Office Action filed Feb. 22, 2017 in U.S. Appl. No. 14/601,093.
Response to Final Office Action filed Mar. 21, 2017 in U.S. Appl. No. 14/600,753.
Final Office Action dated Apr. 4, 2017 in U.S. Appl. No. 14/601,097.
Response to Office Action filed Apr. 10, 2017 in U.S. Appl. No. 14/601,088.
Office Action dated Jun. 1, 2017 in U.S. Appl. No. 14/600,753.
"International Preliminary Report on Patentability Issued in PCT Application No. PCT/US2016/012008", dated Apr. 19, 2017.
Office Action dated Jun. 16, 2017 in U.S. Appl. No. 14/601,093.
Response to Office Action filed Jun. 30, 2017 in U.S. Appl. No. 14/601,097.
International Preliminary Report on Patentability Issued in PCT Application No. PCT/US2015/067979, dated Apr. 7, 2017.
Non-final Office Action dated Jul. 26, 2017, U.S. Appl. No. 14/601,088, filed Jan. 20, 2015.
Non-final Office Action dated Aug. 10, 2017, U.S. Appl. No. 14/601,097, filed Jan. 20, 2015.

\* cited by examiner

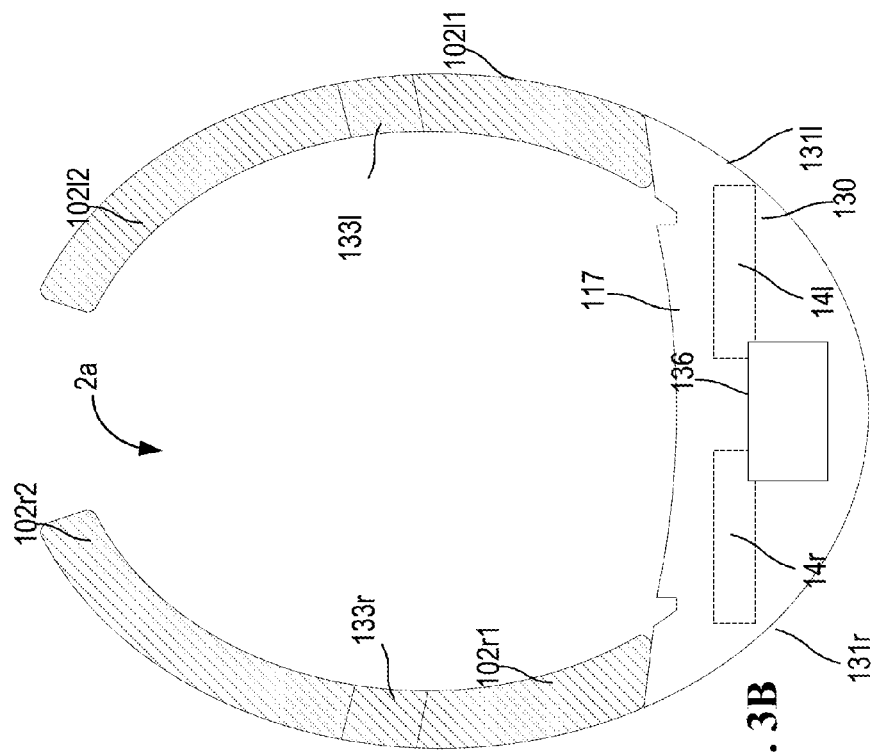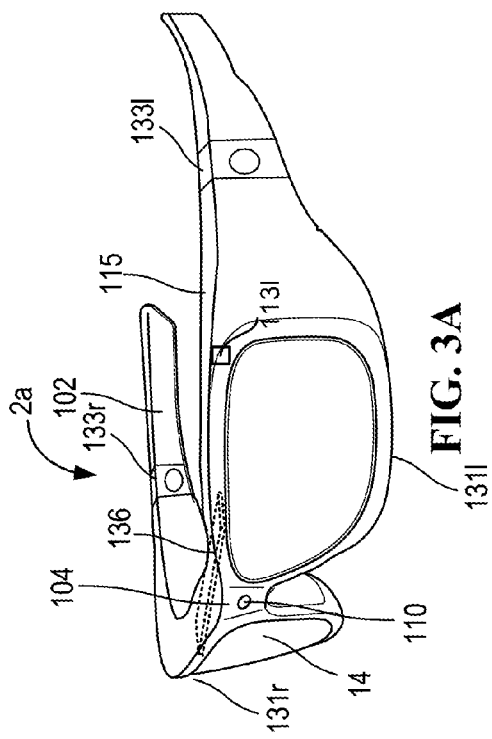
FIG. 3A
FIG. 3B

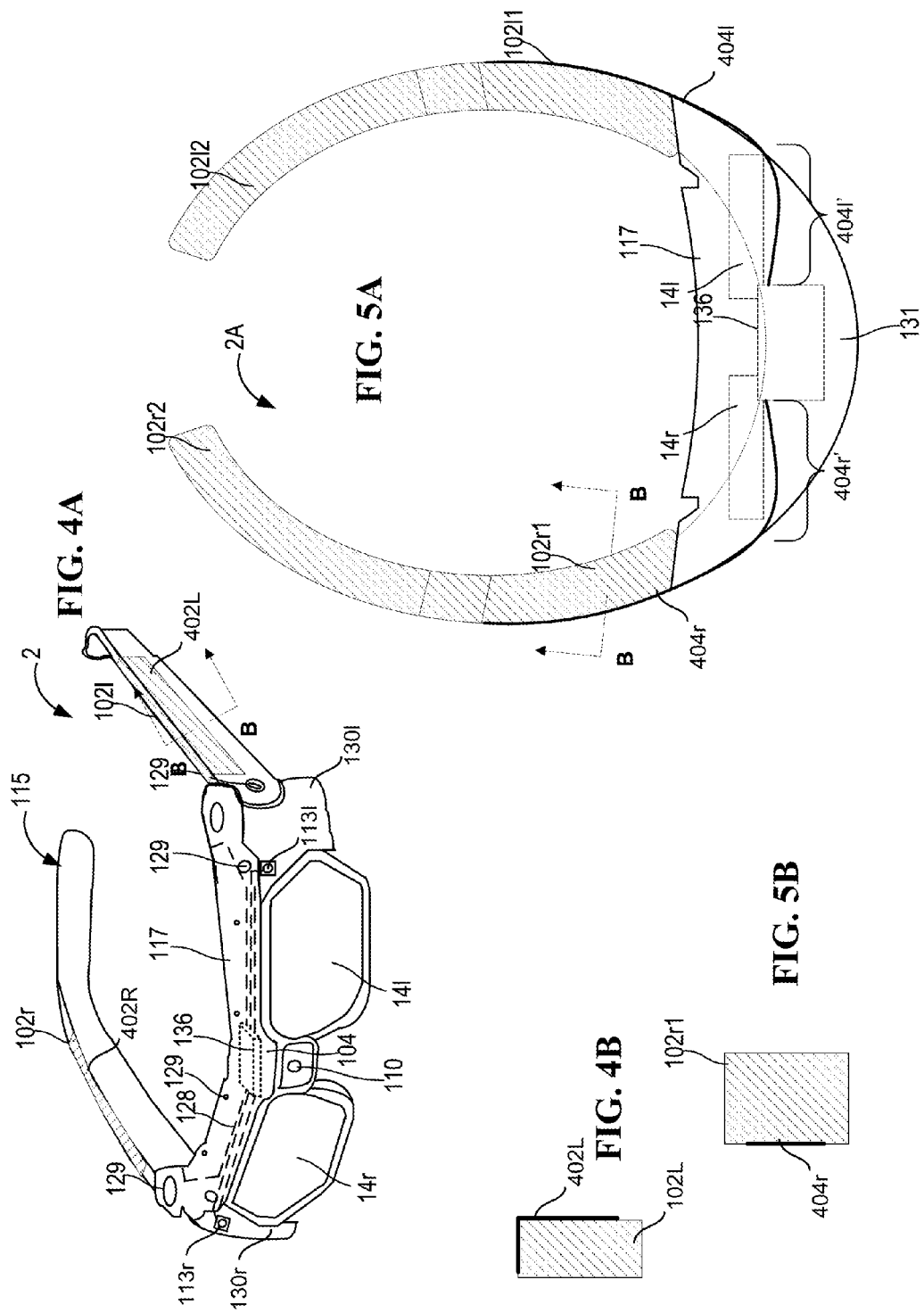

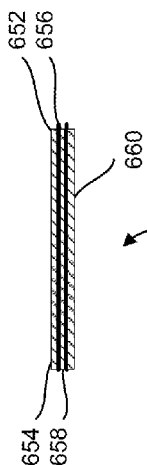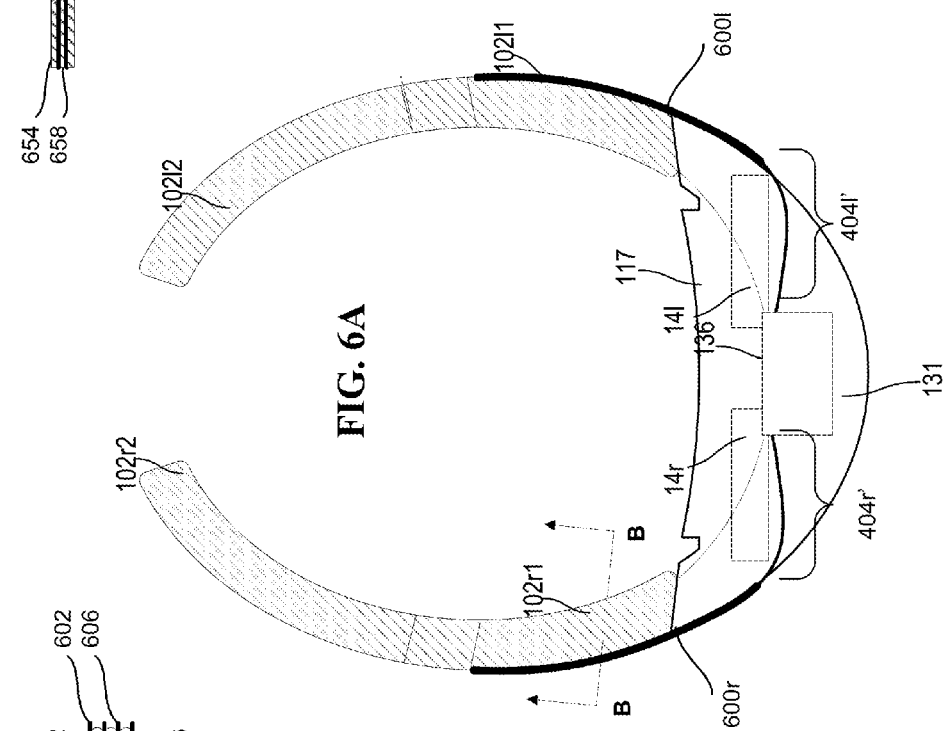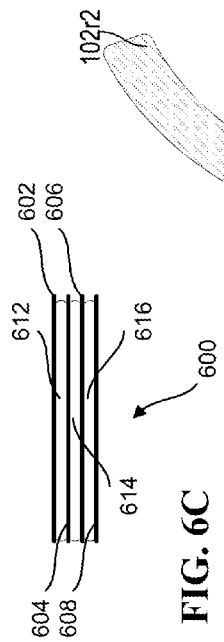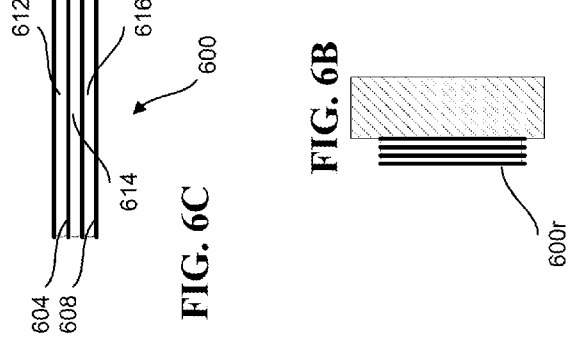

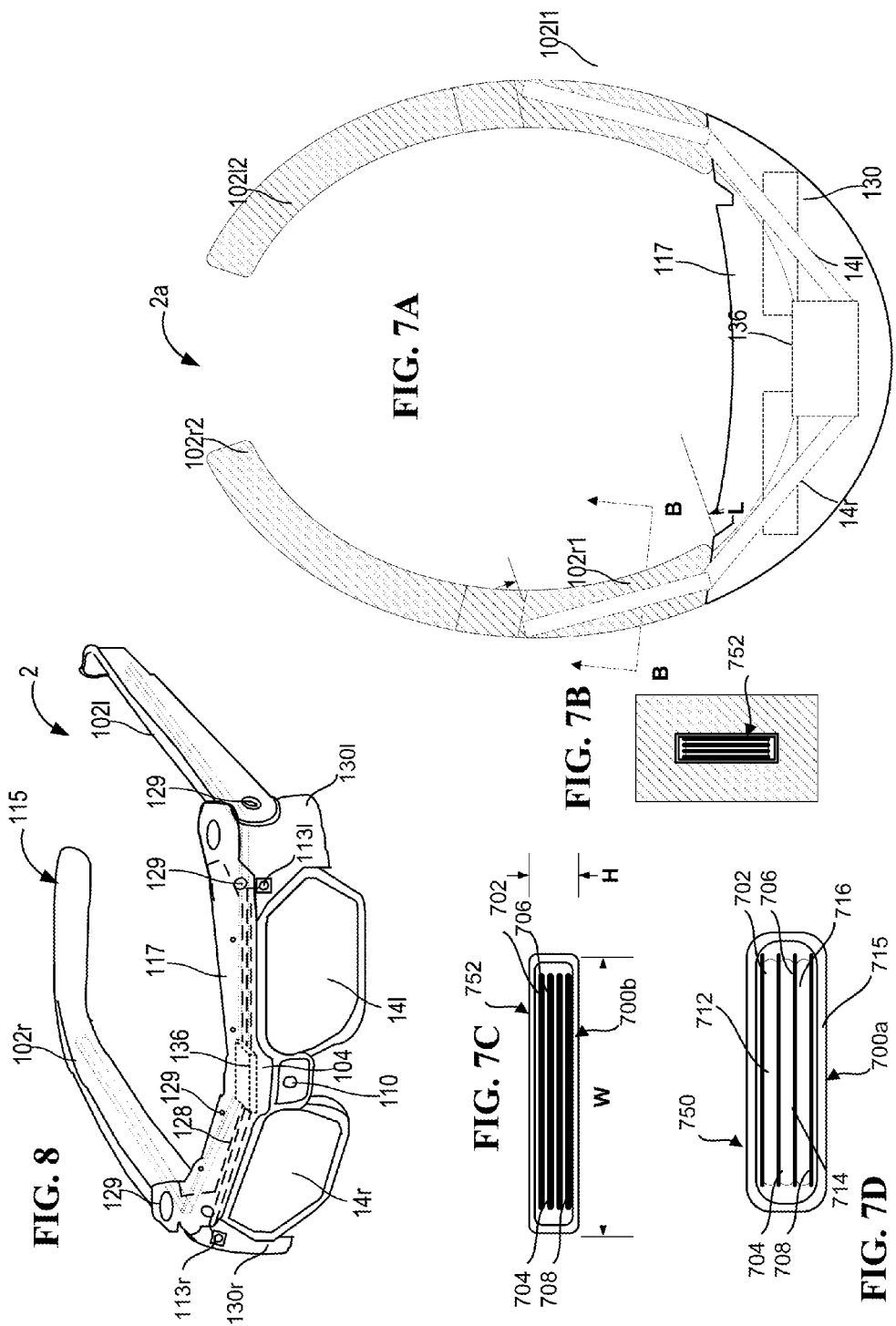

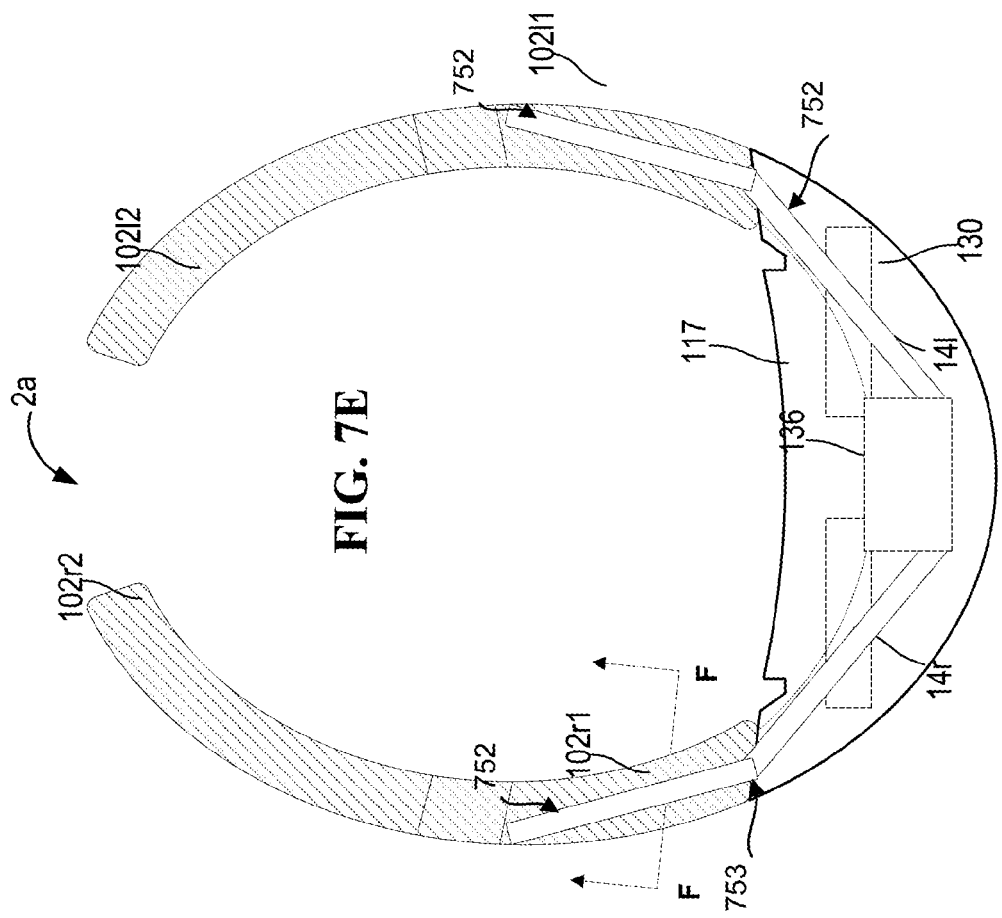
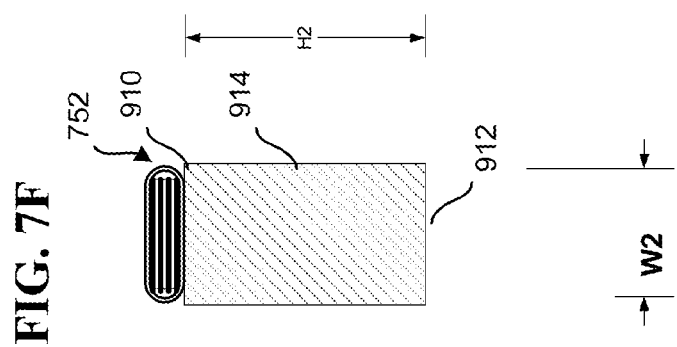

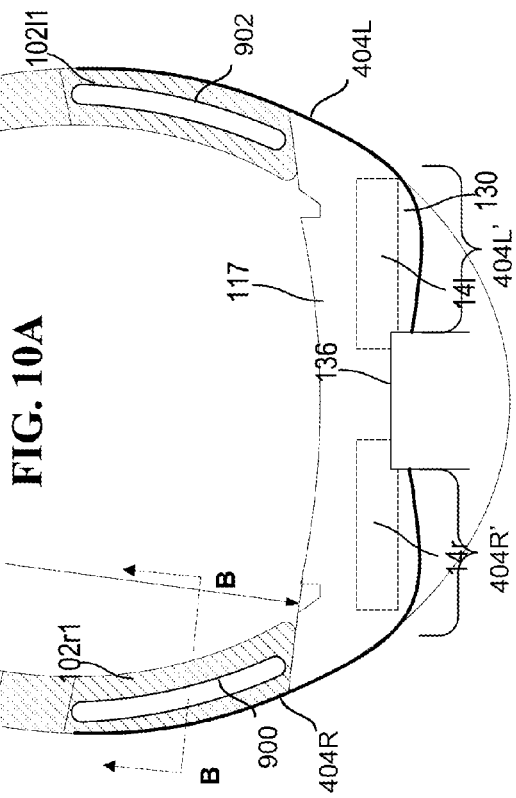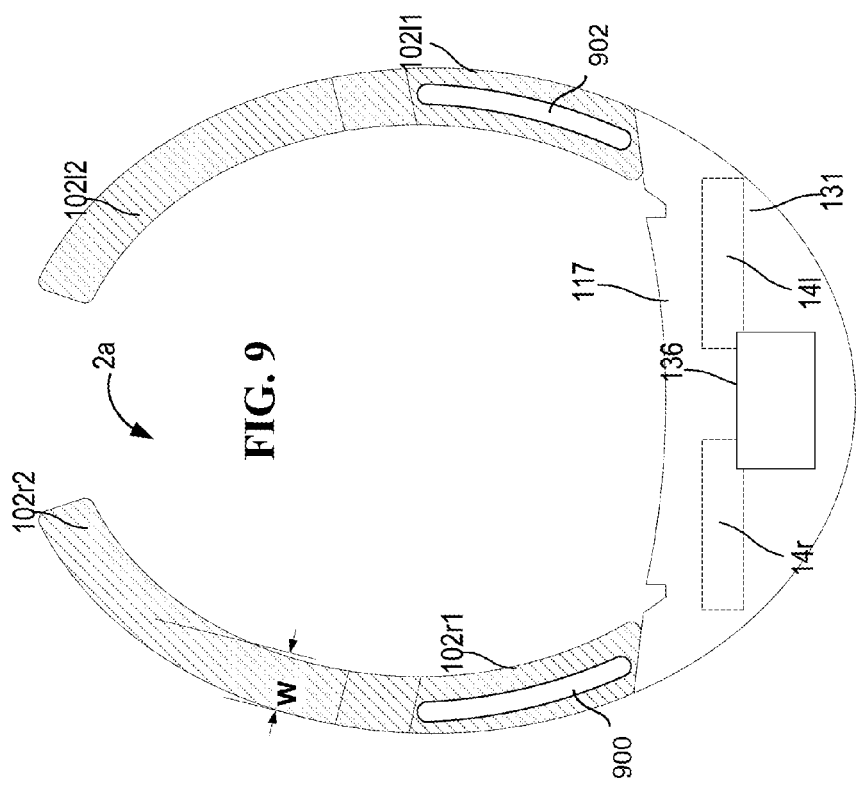

BONDED MULTI-LAYER GRAPHITE HEAT PIPE

BACKGROUND

A see-through, mixed reality display device system enables a user to observe digital information overlaid on the physical scenery. To enable hands-free user interaction, a see-through, mixed reality display device system may further be equipped with an eye tracker, sensors and displays, all of which are sensitive to mis-alignment if the optical platform or frame on which they are mounted distorts. Like all devices which include electronic components, the components produce heat which must be redistributed to areas of the device that are not adjacent to the components. This ensures proper component operation and optical platform stability.

SUMMARY

The technology briefly described comprises a passive pseudo-heat pipe structure used in a wearable device. The structure includes a multilayer stack of graphite sheets, each sheet having a plane high thermal conductivity oriented along a first axis and a plane of lower thermal conductivity along a second axis different from the first axis. The axis of each layer are aligned. The stack has a three-dimensional shape including a length and a width where the length is longer than the width and the first axis aligns parallel to said length, the multilayer stack having a height less than the width. A plurality of bonding layers interspersed between each sheet of the multilayer stack, each bonding layer thermally coupling each sheet to a respective adjacent sheet. The bonding layers may comprise metal layers or adhesive layers. The pipe structure may be used in an optical mounting structure having heat producing control circuitry and temple arms adapted to secure the mounting structure to the head of a wearer. In this embodiment, a bonded stack of graphite layers is thermally bonded to at least any or some of a device's heat emitting components circuitry and the optical mounting structure, each layer having a plane high thermal conductivity along a first axis and a lower thermal conductivity along a second axis.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIG. 3A is a perspective view and FIG. 3B is a top view of a second example of a head mounted display embodiment of a near-eye display device system.

FIG. 4A is an example of a first thermal management solution including a bonded graphite layer attached to a head mounted display.

FIG. 4B is a cross section along lines B-B in FIG. 4A.

FIG. 5A is an example of the first thermal management solution including a bonded graphite layer attached to another embodiment of a head mounted display.

FIG. 5B is a cross section along lines B-B in FIG. 5A.

FIG. 6A is a top view of a of a head mounted display embodiment of a near-eye display device system illustrating another thermal management solution including a multi-layer graphite stack.

FIG. 6B is a cross-section along line B-B in FIG. 6A.

FIG. 6C is an enlarged view of a multiple graphite layer stack.

FIG. 6D is a cross-section of another embodiment of a multi-layer copper/graphene stack.

FIG. 7A is a top view of a of a head mounted display embodiment of a near-eye display device system illustrating another thermal management solution including an encased graphite stack structure.

FIG. 7B is a cross-section along line B-B in FIG. 7A.

FIG. 7C is an enlarged view of a first embodiment of an encased multiple graphite layer stack.

FIG. 7D is an enlarged view of a second embodiment of an encased multiple graphite layer stack.

FIG. 7E is a top view of a of a head mounted display embodiment of a near-eye display device system illustrating an encased graphite stack structure mounted to the exterior of the system.

FIG. 7F is a cross-sectional view along line F-F in FIG. 7E.

FIG. 8 is a perspective view of the first embodiment of the head mounted display device utilizing an embedded and encased graphite stack.

FIGS. 9 and 10A are top views illustrating another thermal management solution including a buttressed frame structure.

DETAILED DESCRIPTION

Figure 1:
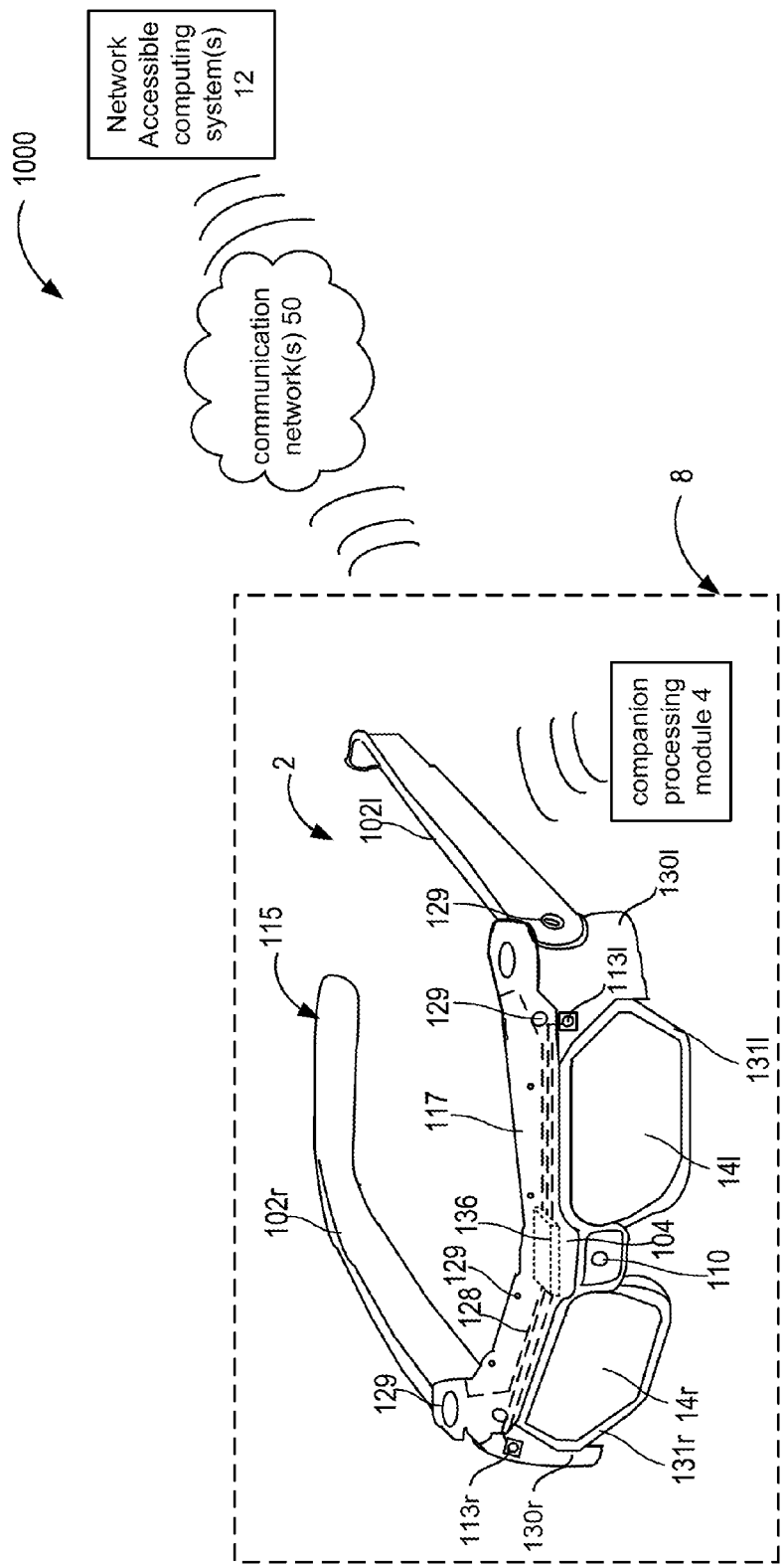
FIG. 1 is a block diagram depicting example components of an embodiment of a near-eye display (NED) device system.

The technology provides techniques for thermal management in wearable devices. utilizing a combination of techniques to remove heat from areas of active components in the device. In one embodiment, the device is a head mounted display and a passive pseudo heat pipe structure is provided. A passive pseudo-heat pipe structure used in a wearable device includes a multilayer stack of graphite sheets, each sheet having a plane high thermal conductivity oriented along a first axis and a plane of lower thermal conductivity along a second axis different from the first axis. The stack has a three-dimensional shape including a length and a width where the length is longer than the width and the first axis aligns parallel to said length, the multilayer stack having a height less than the width. A plurality of bonding layers interspersed between each sheet of the multilayer stack, each bonding layer thermally coupling each sheet to a respective adjacent sheet. The bonding layers may comprise metal layers or adhesive layers. The pipe structure may be used in an optical mounting structure having heat producing control circuitry and temple arms adapted to secure the mounting structure to the head of a wearer. In this embodiment, a bonded stack of graphite layers is thermally bonded to at least the control circuitry and the optical mounting structure, each layer having a plane high thermal conductivity along a first axis and a lower thermal conductivity along a second axis.

The technology will be described with reference to a see-through head mounted display device, and the issues attending thermal management in such a device. It will be recognized that the thermal management techniques described herein may be expanded to alternative wearable technology, as well as any devices where thermal management using passive heat transfer technology would be useful.

The technology will be described with reference to a see-through head mounted display device, and the issues attending thermal management in such a device. It will be recognized that the thermal management techniques described herein may be expanded to alternative wearable technology, as well as any devices where thermal management using passive heat transfer technology would be useful.

Head-mounted displays, like other high powered computing devices produce large amounts of heat that needs to be quickly and efficiently directed away from the source and dissipated into the environment. This is useful in wearable devices as the surface/skin temperature of the device affects the usability and comfort of the user. There are a number of effective methods for transferring and dissipating heat currently used in the electronics industry. Traditional methods for cooling high powered electronics include passive cooling methods that are generally bulky and heavy and not particularly suitable for being used in wearable devices. In addition, typical materials used in cases (e.g. polycarbonate, LCP) have very poor thermal properties and create inefficiencies in the thermal system as a whole. Improving even small inefficiencies in the thermal system will allow for better device performance and longevity over all.

FIG. 1 is a block diagram depicting example components of a waveguide display implemented in a Near Eye Display (NED) system 8 including a compact projection light engine and diffractive waveguide. In the illustrated embodiment, a NED device system 8 includes a near-eye display (NED) device in a head-mounted display (HMD) device 2 and companion processing module 4. HMD 2 is communicatively coupled to companion processing module 4. Wireless communication is illustrated in this example, but communication via a wire between companion processing module 4 and HMD 2 may also be implemented. In an embodiment, HMD 2 includes a NED device having a projection light engine 120 and near-eye display 14 having a waveguide.

In this embodiment, HMD 2 is in the shape of eyeglasses having a frame 115, with each display optical system 14*l* and 14*r* positioned at the front of the HMD 2 to be seen through by each eye when worn by a user. Each display optical system 14*l* and 14*r* is also referred to as a display or near-eye display 14, and the two display optical systems 14*l* and 14*r* together may also be referred to as a display or near-eye display 14. In this embodiment, each display optical system 14*l* and 14*r* uses a projection display in which image data (or image light) is projected into a user's eye to generate a display of the image data so that the image data appears to the user at a location in a three dimensional field of view (FOV) in front of the user.

In this embodiment, frame 115 provides a convenient eyeglass frame holding elements of the HMD 2 in place as well as a conduit for electrical and thermal connections. In an embodiment, frame 115 provides a NED device support structure for a projection light engine 120 and a near-eye display 14 as described herein. Some other examples of NED device support structures are a helmet, visor frame, goggles support or one or more straps. The frame 115 includes a nose bridge 104, an optical system structure or housing 131 (including a left side housing 131*l* and right side housing 131*r*) joined by the nose bridge 104, a front top cover section 117, a respective projection light engine housing 130 for each of a left side housing (130*l*) and a right side housing (130*r*) of HMD 2 as well as left and right temples or side arms 102*l* and 102*r* which are designed to rest on each of a user's ears. In this embodiment, nose bridge 104 includes a microphone 110 for recording sounds and transmitting audio data to control circuitry 136. On the exterior of the side housing 130*l* and 130*r* are respective outward capture devices 113*l* and 113*r* (such as cameras) which capture image data of the real environment in front of the user for mapping what is in a FOV of a near-eye display (NED) device. The frame components 115, 117, 104, 130, 131 comprise an optical mounting structure for the display optical systems 14 and the sensors including microphone 110 and cameras 113.

In this embodiment, dashed lines 128 are illustrative examples of some electrical connection paths which connect to control circuitry 136, also illustrated in dashed lines. One dashed electrical connection line is labeled 128 to avoid overcrowding the drawing. The electrical connections and control circuitry 136 are in dashed lines to indicate they are under the front top cover section 117 in this example. As noted in the drawings, the control circuitry and other electronic components such as the displays are mounted to interior surfaces of the optical mounting structure or housing. There may also be other electrical connections (not shown) including extensions of a power bus in the side arms for other components, some examples of which are sensor units including additional cameras, audio output devices like earphones or units, and perhaps an additional processor and memory. Some examples of connectors 129 as screws are illustrated which may be used for connecting the various parts of the frame together.

The companion processing module 4 may take various embodiments. In some embodiments, companion processing module 4 is in a portable form which may be worn on the user's body, e.g. a wrist, or be a separate portable computing system like a mobile device (e.g. smartphone, tablet, laptop). The companion processing module 4 may communicate using a wire or wirelessly (e.g., WiFi, BLUETOOTH® telecommunication services, infrared, an infrared personal area network, RFID transmission, wireless Universal Serial Bus (WUSB), cellular, 3G, 4G or other wireless communication means) over one or more communication network(s) 50 to one or more network accessible computing system(s) 12, whether located nearby or at a remote location. In other embodiments, the functionality of the companion processing module 4 may be integrated in software and hardware components of HMD 2.

Image data is identified for display based on an application (e.g. a game or messaging application) executing on one or more processors in control circuitry 136, companion processing module 4 and/or network accessible computing system(s) 12 (or a combination thereof) to provide image data to near-eye display 14.

Figure 2A:
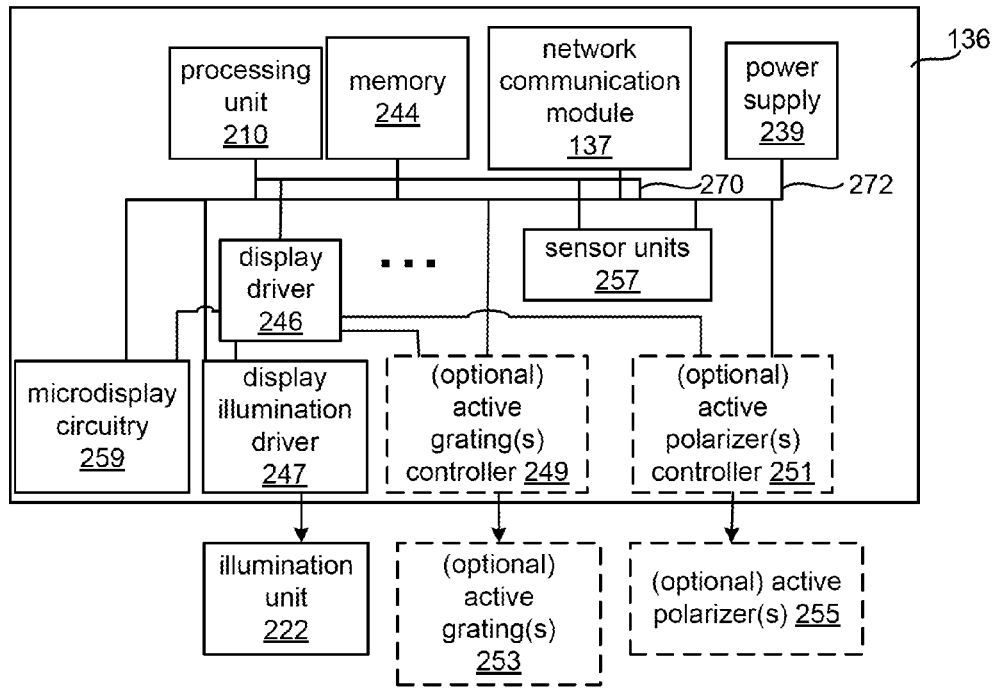
FIG. 2A is a block diagram of example hardware components in a control circuitry embodiment of a NED device.

FIG. 2A is a block diagram of example hardware components including a computing system within control circuitry of a NED device. Control circuitry 136 provides various electronics that support the other components of HMD 2. In this example, the control circuitry 136 for a HMD 2 comprises a processing unit 210, a memory 244 accessible to the processing unit 210 for storing processor readable instructions and data. A network communication module 137 is communicatively coupled to the processing unit 210 which can act as a network interface for connecting HMD 2 to another computing system such as the companion processing module 4, a computing system of another NED device or one which is remotely accessible over the Internet. A power supply 239 provides power for the components of the control circuitry 136 and the other components of the HMD 2 like the capture devices 113, the microphone 110, other sensor units, and for power drawing components for displaying image data on near-eye display 14 such as light sources and electronic circuitry associated with an image source like a microdisplay in a projection light engine.

The processing unit 210 may comprise one or more processors (or cores) such as a central processing unit (CPU) or core and a graphics processing unit (GPU) or core. In embodiments without a separate companion processing module 4, processing unit 210 may contain at least one GPU. Memory 244 is representative of the various types of memory which may be used by the system such as random access memory (RAM) for application use during execution, buffers for sensor data including captured image data and display data, read only memory (ROM) or Flash memory for instructions and system data, and other types of nonvolatile memory for storing applications and user profile data, for example. FIG. 2A illustrates an electrical connection of a data bus 270 that connects sensor units 257, display driver 246, processing unit 210, memory 244, and network communication module 137. Data bus 270 also derives power from power supply 239 through a power bus 272 to which all the illustrated elements of the control circuitry are connected for drawing power.

Figure 2B:
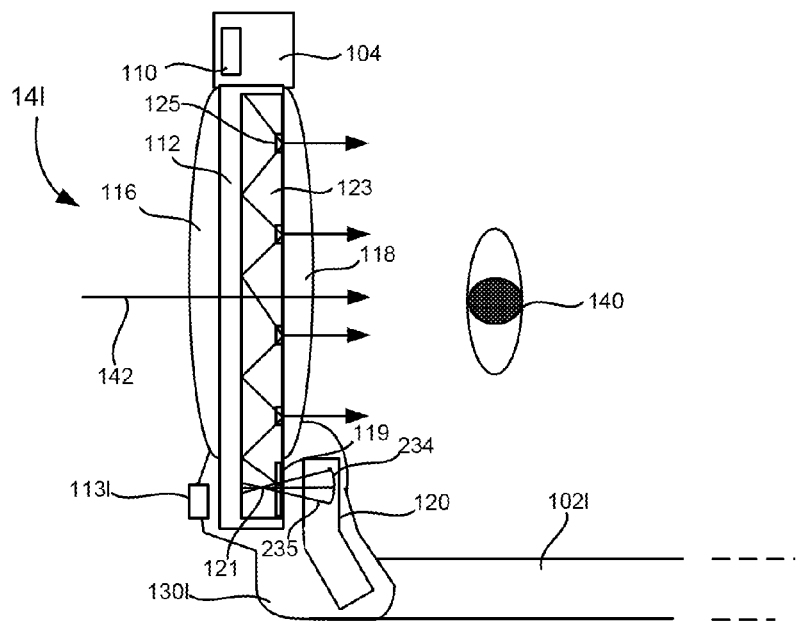
FIG. 2B is a top view of a near-eye display embodiment being coupled with a projection light engine having an external exit pupil.

Control circuitry 136 further comprises a display driver 246 for selecting digital control data (e.g. control bits) to represent image data that may be decoded by microdisplay circuitry 259 and different active component drivers of a projection light engine (e.g. 120 in FIG. 2B). A microdisplay, such as microdisplay 230 shown in FIG. 3C, may be an active transmissive, emissive or reflective device. For example, a microdisplay may be a liquid crystal on silicon (LCoS) device requiring power or a micromechanical machine (MEMs) based device requiring power to move individual mirrors. An example of an active component driver is a display illumination driver 247 which converts digital control data to analog signals for driving an illumination unit 222 which includes one or more light sources, such as one or more lasers or light emitting diodes (LEDs). In some embodiments, a display unit may include one or more active gratings 253, such as for a waveguide, for coupling the image light at the exit pupil from the projection light engine. An optional active grating(s) controller 249 converts digital control data into signals for changing the properties of one or more optional active grating(s) 253. Similarly, one or more polarizers of a projection light engine may be active polarizer(s) 255 which may be driven by an optional active polarizer(s) controller 251. The control circuitry 136 may include other control units not illustrated here but related to other functions of a HMD 2 such as providing audio output, identifying head orientation and location information.

FIG. 2B is a top view of an embodiment of a near-eye display 14*l* being coupled with a projection light engine 120 having an external exit pupil 121. In order to show the components of the display optical system 14, in this case 14*l* for the left eye, a portion of the top frame cover 117 covering the near-eye display 14*l* and the projection light engine 120 is not depicted. Arrow 142 represents an optical axis of the near-eye display 14*l*.

In this embodiment, the near-eye displays 14*l* and 14*r* are optical see-through displays. In other embodiments, they can be video-see displays. Each display includes a display unit 112 illustrated between two optional see-through lenses 116 and 118 and including a waveguide 123. The optional lenses 116 and 118 are protective coverings for the display unit. One or both of them may also be used to implement a user's eyeglass prescription. In this example, eye space 140 approximates a location of a user's eye when HMD 2 is worn. The waveguide directs image data in the form of image light from a projection light engine 120 towards a user's eye space 140 while also allowing light from the real world to pass through towards a user's eye space, thereby allowing a user to have an actual direct view of the space in front of HMD 2 in addition to seeing an image of a virtual feature from the projection light engine 120.

In some embodiments, a waveguide 123 may be a diffractive waveguide. Additionally, in some examples, a waveguide 123 is a surface relief grating (SRG) waveguide. An input diffraction grating 119 couples an image light from a projection light engine 120. Additionally, a waveguide has a number of exit gratings 125 for an image light to exit the waveguide in the direction of a user's eye space 140. One exit grating 125 is labeled to avoid overcrowding the drawing. In this example, an outermost input diffraction grating 119 is wide enough and positioned to capture light exiting a projection light engine 120 before the light exiting the projection light engine has reached its exit pupil 121. The optically coupled image light forms its exit pupil in this example at a central portion of the waveguide.

FIG. 2B shows half of a HMD 2. For the illustrated embodiment, a full HMD 2 may include another display optical system 14 with another set of optional see-through lenses 116 and 118, another waveguide 123, as well as another projection light engine 120, and another of outward facing capture devices 113. In some embodiments, there may be a continuous display viewed by both eyes, rather than a display optical system for each eye. In some embodiments, a single projection light engine 120 may be optically coupled to a continuous display viewed by both eyes or be optically coupled to separate displays for the eyes. Additional details of a head mounted personal A/V apparatus are illustrated in U.S. patent application Ser. No. 12/905,952 entitled Fusing Virtual Content Into Real Content, Filed Oct. 15, 2010 now issued as U.S. Pat. No. 8,884,984.

FIGS. 3A and 3B an alternative embodiment of the HMD layout and frame structure. Like numerals for the embodiment the representations of FIGS. 3A and 3B represent like parts to those parts illustrated in the embodiment of FIGS. 1-2. FIG. 3A is a perspective view and FIG. 3B a top view of an HMD 2*a*.

In the embodiment of FIGS. 3A and 3B, frame 115 may by generally referred to as a wraparound-type frame, where the display optical systems 14 are integrated or mounted into a polymer, plastic or composite frame material comprising elements 110, 131, 102. The temple or side arms 102 may be created to wrap around the head of a wearer and rest on the wearer's ears. In one embodiment, the temples are created by a forward component 102*r*1 and 102*l*1 and a rear component 102*r*2 and 102*l*2. A mechanical adjustment 133*r*, 133*l* may be provide between the forward and rear portions of temples 102. In an alternative embodiment, the temples or side arms 102 may be continuous. Control circuitry 136 is located to be in a similar position in the embodiment of FIGS. 3 and 4 with respect to the embodiment of FIGS. 1 and 2.

Those skilled in the art will readily understand that electronic components and circuitry utilized in the systems 2 and 2*a* operate more efficiently when cooling takes place between the circuits and the ambient environment. In a system 2 and 2*a*, cooling components may raise ambient temperatures of the structural components to a temperature higher than the ambient but insufficient for a wearer to notice. For example, an exemplary temperature range imperceptible to a human wearer would be less than 50 deg. F.

In order to provide passive heat dissipation, various techniques and combinations thereof may be utilized.

Nanocarbon Infused Frame Elements

In one embodiment, carbon nanoparticles are mixed with the frame material to provide efficient passive heat transfer within the device frame 115 including frame components 102, 130 131, 110, and 115. The carbon nanoparticles increase the thermal conduction properties of the frame elements and provide a lightweight way of increasing the thermal conduction of a base material such as a polymer used to create the frame. A number of heat emitting electrical components, such as the control circuitry and power supplies discussed above, are included in the device. The techniques discussed herein provide various means for removing heat from the heat emitting electrical components in a wearable device.

Carbon nanoparticles, nanodots or nanopowder may comprise spherical high surface area graphitic carbon. Carbon nanoparticles may comprise graphene, and in particular single layer graphene (SLG), bilayer graphene (BLG), few layer graphene (FLG), multilayer graphene (MLG) carbon nanotubes, pyrolytic graphite flakes or any other nanocarbon geometries. Carbon nanoparticles may range in size from 10-100 nanometers (nm) in diameter with a specific surface area in the 2-50 m2/g. Carbon nano-particles are available in passivated and high purity, and coated and dispersed forms.

Frames such as those illustrated in FIGS. 1-3B may be formed of molded polymers from any of a number of thermoplastic polymers, including, for example acrylonitrile butadiene styrene plastic (Acrylonitrile Butadiene Styrene, ABS), which has a high degree of rigidity and plasticity characteristics. Plastic is plasticized styrene (Polymerising Styrene), propylene (Acrylonitrile) and polybutadiene (Polybutadiene) mixed into butadiene rubber (Latex). The base material may have added thereto and amount of 2-10% loading by volume of carbon nanoparticles, nanopowder, pyrolytic graphite flakes or carbon nanotubes. Adding the carbon material to the material matrix prior to formation process for components 102, 130, 131 improves the thermal conductivity of each of the components. In the process, the carbon nanoparticles can be added simultaneously additives such as stabilizers, lubricants and coloring materials. It will be appreciated that any suitable polymer material which may be formed into a desired shape and which when cooled provides a suitable rigidity to ensure stability for the optical platform (display systems 14) under various wearable conditions can be used. The percentage by concentration of the carbon nanoparticles may be in a range of 2 to 10% and in a range of 2-4% loading by volume.

The nanocarbon infused structural components may be used in conjunction with any of the later described thermal management techniques described herein.

Formation of frame parts in accordance with a method of the present technology includes the use of injection molding and extrusion molding techniques to form the molded parts for the frame 115. In order to create a part such as temple 102*r* or 102 *r*1, an injection molding process includes steps of: (1) providing an injection molding apparatus; (2) mixing the base polymer pellets or powder comprising the frame material and carbon microparticles uniformly; (3) obtaining the mixture from step (2) and adding the mixture to the injection molding apparatus including a heating cylinder; (4) melting the mixture at high temperature to create a molten mixture; (5) injecting the molten mixture through an injection nozzle into a closed mold cavity; (6) and cooling the molten mixture in a mold to solidify the desired component. An extrusion process includes (1) providing a extrusion molding device; (2) mixing the engineering polymer pellets or powder comprising the frame material and carbon nanosphere particles uniformly; (3) obtaining the mixture; (4) melting the mixture at high temperature; and (4) forming a molten mixture through a die; and cooling the molten mixture in a mold to solidify the desired part.

In accordance with the present technology, at least temples 102*r*1 and 102*l* may be formed of nanocarbon infused materials. In a further embodiment with respect to HMD 2*a*, at least elements 102*r*1 and 102*/*1 are formed of nanocarbon infused materials. It will be readily understood that any of the components 102, 117, 130, 131 may be formed of nanocarbon infused materials. In a further embodiment, elements 102*r*2 and 102*/*2 are formed of nanocarbon infused materials.

In alternative embodiments, the carbon nanoparticles may comprise pyrolytic graphite flakes or carbon nanotubes. In any embodiment, the frame may comprise a polycarbonate with a 2%-4% loading by volume of mono-layer graphene flakes with a very large aspect ratio to replace glass-filled polycarbonate. The current material is being used for its robustness, strength and ability to be injection molded. The graphene doped polymer possesses all the same increased properties mechanically, but also boasts a high increase in thermal properties. The increased thermal conductivity of the doped polymer will allow for better heat spreading on the surface on the device, resulting in lower touch temperatures as well as more efficient thermal dissipation from the electronics and display.

Graphene doped polymers, unlike other filled polymers, also create electrically conductivity. As such, the amount of graphene and type (shape-factor, size of flakes, number of atomic layers, aspect ratio, etc.) can be custom tailored to meet the needs of the product and sub-assemblies with respect to EMI shielding.

Bonded Graphite Layer

A further embodiment of the present technology utilizes graphite or graphene thermal pseudo-heat pipe to remove heat from the active circuitry 136. FIGS. 4A-5B represent an embodiment of a wearable device utilizing the present technology.

Graphites possess anisotropic structures and thus exhibit or possess many properties that are highly directional e.g. thermal and electrical conductivity and diffusion. Graphites are made up of layer planes of hexagonal arrays or networks of carbon atoms. These layer planes of hexagonally arranged carbon atoms are substantially flat and are oriented or ordered so as to be substantially parallel and equidistant to one another. The substantially flat, parallel equidistant sheets or layers of carbon atoms, usually referred to as graphene layers or basal planes, are linked or bonded together and groups thereof are arranged in crystallites. As used herein, the term "graphene" or "graphene film" denotes the atom-thick carbon sheets or layers that stacks up to form cleavable layers (or mica-like cleavings) in graphite.

Graphite may be made up of a plurality layers or planes. A heat sink design can be a complex task requiring extensive math—finite element analysis, fluid dynamics, etc. In designing heat sinks, various factors are taken into consideration, including thermal resistance, area of the heat sink, and the shape of the heat sink.

Some types of graphite, such as pyrolytic graphite, are available in a sheet form, which has a high thermal conductivity in the plane of the sheet and a lower thermal conductivity perpendicular to the plane of the sheet. In one form, the pyrolytic graphite is oriented such that the high-conductivity plane lies parallel to the direction of heat transfer (away from the active circuitry 136 and toward the ends of temples 102.

In one embodiment, a graphite layer contacts at least a portion of the active circuitry 136 and is routed to an exterior portion of the frame 115. As used herein, the term "graphite layer" refers to at least one graphene layer. A graphite layer may in some embodiments comprise a sheet of pyrolytic graphite.

FIG. 4A illustrates an attached graphite layer 402 (comprising a left side layer 402l and right side layer 402r) provided on the HMD 2 in the embodiment of FIG. 1. FIG. 4B is a cross-section of the graphite layer 402 applied to the temples 102 of the frame 115. It will be understood that a thermal coupling of graphite or another thermally conductive material may be routed from the circuitry 136 to the graphite layer 402. As seen in the cross-section of FIG. 4B, the layer may be applied to the side of the temples 102 and/or to the top of the temple. Other configurations of the graphite layer 402 will be understood to be within the scope of the present technology, including providing the layer 402 on three sides of the frame and providing the layer 402 on all four sides of the frame. The technology is not limited to the shape of the frame, nor the particular nature of the wearable device.

FIG. 5A illustrates an attached graphite layer 404 utilized in the HMD 2A. As illustrated therein, graphite layer 404 (comprising a left side layer 404l and right side layer 404r) are attached to temples 102 (and in particular portions 102l1 and 102r1, respectively). A portion 404r' and 404l' of each graphite layer engages circuitry 136, with the layer attached to the exterior of the temples 102l1 and 102r1. As illustrated in FIG. 5b, the graphite layer 404 is secured to the exterior wall of each temple (in this view, temple 102r1).

In one embodiment, the graphite layer may comprise pyrolytic graphite. Pyrolytic graphite is a form of graphite manufactured by using a raw material of a highly crystalline polymer. The polymer is put through a pyrolysis process devoid of oxygen. Not having oxygen keeps combustion from occurring and instead all the volatiles present in the polymer chains are released and resulting in a base structure of carbon rings. High temperature and pressure annealing then occurs to wedge those polymer backbones of carbon into a layered sheet structure viable for high thermal conductivity. The material is grown onto a substrate giving it a layered composition and may have different properties in different planes. Commercially available pyrolytic graphite is available in conductivities ranging from 700 W/mk to 2000 W/mK and in sheet thicknesses ranging from 10-150 µm.

It should be understood that "pyrolythic graphite" may include "thermal pyrolytic graphite" as well as "highly oriented pyrolytic graphite", and "compression annealed pyrolytic graphite," referring to graphite materials consisting of crystallites of considerable size, the crystallites being highly aligned or oriented with respect to each other and having well ordered carbon layers or a high degree of preferred crystallite orientation, with an in-plane (a-b direction) thermal conductivity greater than 1,000 W/m-K. In one embodiment, the TPG has an in-plane thermal conductivity greater than 1,500 W/m-K The graphite layer may be selected from any material having a high thermal conductivity including pyrolytic graphite, thermal pyrolytic graphite, compression annealed pyrolytic graphite, thermal pyrolytic graphite, highly ordered pyrolytic graphite, pyrolytic graphite, and the like.

In one embodiment, the graphite layer is attached to the temples 102 using a suitable adhesive material. In one embodiment, it is desirable to attach the graphite under constraints which would not adversely affect the sensitive components of the electronics or sensors, nor the mechanical stability of the frame. Because the components (such as cameras 113 and microphone 110 may be sensitive to misalignment if frame 115 becomes mechanically distorted, post-processing of the frame 115 to apply the graphite layer may adversely affect the performance of the device 2/2a.

Graphite layers 402, 404 may be secured to HMDs 2/2A using any suitable form of adhesive to bond the graphite layer to the material comprising the frame elements. Suitable adhesive materials include, for example, inorganic and organic adhesives. An exemplary adhesive material is an epoxy. In one embodiment, the bonding material exhibits thermal conductivity properties, e.g., a thermally conductive epoxy. Acrylic adhesives may also be utilized.

Suitable graphite layers include pyrolytic graphite sheets available from Panasonic Corporation. Such sheets may include applications with or without acrylic adhesives and adhesive tapes.

In one embodiment, the graphite layer may be preformed into a shape suitable for application to the frame elements and which may be thermally connected to the control circuitry 136 or other electronic components of an HMD.

In another alternative, graphene may be grown or laminated on one or more surfaces of the frame. Graphene may be applied by any of a number of methods, including by chemical vapor deposition (CVD), SiC thermal decomposition, or a graphene oxide reduction. In a CVD method, a film comprising graphene is formed on one surface of a substrate (which may comprise a portion of the frame) the graphene film tailored for the particular use by the process chosen.

Nanocarbon Infused Frame with Graphite Layer

A further embodiment of the present technology includes the use of nanocarbon infused frame elements with an applied graphite layer.

The combination of the graphite layer in conjunction with the nanocarbon infused material increases the thermal conduction properties of the frame 115. It will be readily understood that any of the components 102, 117, 130, 131 may be formed of nanocarbon infused materials.

In accordance with the present technology, at least temples 102r and 102l may be formed of nanocarbon infused materials and have applied thereto a graphite layer in accordance with the foregoing embodiments wherein the graphite layer bonds to a surface of the temple 102l1 and 102r1. In a further embodiment, elements 102R2 and 102L2 are formed of nanocarbon infused materials.

Graphite layers 402, 404 may be secured each other using any suitable form of adhesive to bond the graphite layers to each other, and the stack to the material comprising the frame elements. Suitable adhesive materials include, for example, the inorganic and organic adhesives provided above including epoxy. In one embodiment, the bonding material exhibits thermal conductivity properties, e.g., a thermally conductive epoxy. Acrylic adhesives may also be utilized. Suitable graphite layers include any of the pyrolytic graphite materials discussed herein and may include pyrolytic graphite sheets available from Panasonic Corporation. Such sheets may include applications with or without acrylic adhesives and adhesive tapes. In one embodiment, the adhesives used are curable at ambient temperatures in a range of 60-80 degrees Fahrenheit.

It will be understood that the application of a graphite layer in combination with the nanocarbon infused frame elements may further be enhanced by use of any of the below thermally conductive graphite structures described herein.

In order to create a part such as temple 102r or 102r1, use of the injection molding and/or extrusion process discussed above may be utilized. Following the aforementioned cooling steps, the graphite layer may be applied to the desired location of the part by (1) forming the graphite layer into a suitable shape for application to the part surface, (2) applying one of the aforementioned adhesives to the frame element in a contact region; (3) applying the graphite layer and (4) applying a uniform pressure to the graphite layer to allow curing of the adhesive to secure the layer to the part.

Graphite Layer Stack

A further embodiment of the present technology includes the use a multi-layer stack of graphite layers constructed to be applied to the surface of the elements. Construction of a multi-layer stack of graphite sheets may provide a thermal highway which can be attached to components of the HMD 2/2a.

FIGS. 6A-6C illustrates use of the multilayer stack in conjunction with the graphite layer thermally coupled to the active circuitry 136. FIG. 6A illustrates one configuration of the multiple graphite layer stack in accordance with the technology applied to frame elements of an HMD device and thermally coupled to active circuits in HMD 2a. In FIG. 6A, two stacks 600r and 600l are illustrated A representation of a multilayer stack of graphite layers is illustrated in FIG. 6C. In FIG. 6C, individual graphite layers 602-608 are secured to and sandwich adhesive layers 612-616. While four graphite layers are illustrated, any number of graphite and adhesive layers may be utilized to make stack 600.

One difficulty in assembling stack 602 is that graphite layers by nature not wish to adhere to each other. In addition, granites may be tear sensitive, and the structure can be brittle when applied to the exterior of a frame which can be exposed to ambient conditions. Suitable adhesive materials include, for example, inorganic and organic adhesives. An exemplary adhesive material is an epoxy. In one embodiment, the bonding material exhibits thermal conductivity properties, e.g., a thermally conductive epoxy. Acrylic adhesives may also be utilized. Suitable graphite layers include any of the pyrolytic graphite materials discussed herein. The graphite stack 602 can be formed into any of a number of three-dimensional shapes by configuring the graphite layers assembled into the stack.

In one embodiment, a stack 600 is not coupled by portions 404r' and 404l' to the active circuitry 136, but is attached to any one or more of the surfaces of the frame components such as temples 102, cover section 117, and housing 131.

It will be understood that the application of a graphite layer stack may be utilized in combination with the nanocarbon infused frame elements discussed above.

In order to create a part such as temple 102l1 or 102r1, use of the injection molding and/or extrusion process discussed above may be utilized. Prior to formation of the part or thereafter, a multi-layer stack is created by creating the multilayer stack 600 including (1) forming the graphite layers into a suitable shape to be applied to the surface of a frame element; (2) applying adhesive to a first of the graphite layers followed by (3) applying a second graphite layer on the adhesive; (4) applying uniform pressure to the graphite layer; and (optionally) (5) repeating steps (1)-(3) for any number of additional layers. Alternatively, steps (1)-(3) may be repeated for any number of layers prior to applying uniform pressure to the outermost layer in the stack. Thereafter, the stack 600 is applied to a frame part using any of the aforementioned adhesives discussed herein. The part may be created with any of the materials discussed herein and any of the aforementioned part fabrication processes, with or without infused nanocarbon in the part material.

A thermal coupling structure of graphite (such as region 404r') may be incorporated during stack formation or glued to the stack 600 thereafter.

Although the graphite layer is illustrated in a particular configuration in FIGS. 6A-6C, the layers may be provided in any of a number of regions on the device. Any surface of the temples 102 may include a graphite layer (whether coupled to a thermal coupling or attached to the device to promote heat transfer away from any active components).

In some embodiments, the resulting structure is a flexible structure that can be molded to a surface of the frame, as illustrated, or used in any of a number of applications. The flexibility of the structure and the thermal performance of the structure depends on the bonding layers between the graphite layers.

An alternative embodiment of a graphite layer structure may be formed as a copper-graphene structure 650. In this embodiment, a central, planer sheet of copper 656 having a thickness ranging from 20-50 nm is coated on both sides with layers of graphene 654, 658 after which copper layers 652, 660 are applied to respective graphene layers 654, 658. The graphene may be formed by any of the aforementioned processes and layers 652 and 660 of copper may be deposited by a suitable vapor or physical deposition process.

Encased Graphite Layer Stack

A further embodiment of the present technology includes the use a multi-layer stack of graphite layers constructed within a metallic enclosure which may be thermally connected to active circuitry and thereafter applied to the surface of frame elements to act as a passive pseudo-heat pipe.

FIGS. 7-8 illustrate a multilayer stack of graphite constructed in an enclosed metallic casing. In one embodiment illustrated in FIG. 7D, an encased assembly 750 including the graphite stack 700a may have a structure similar to graphite stack 600 illustrated above. This embodiment, plurality layers 702 through 708 are joined by adhesives 712-716 after which the stack 700a is encased in a metallic layer or coating. FIG. 7C illustrates an alternative embodiment of an encased assembly 750 including stack 700b wherein no adhesive is used between the multiple graphite layers. In the embodiment of FIG. 7C, direct contact between the layers 702-708 and the casing material ensures thermal conduction.

The embodiment of FIG. 7D may be created by: (1) forming a first graphite layer into a suitable shape to be applied to the surface of a frame element; (2) applying adhesive to a first of the graphite layers followed by (3) applying a second graphite layer on the adhesive; (4) applying uniform pressure to the graphite layer; and (optionally) (5) repeating steps (1)-(3) for any number of additional layers. Alternatively, steps (1)-(3) may be repeated for any number of layers prior to applying uniform pressure to the outermost layer in the stack. After creation of stack 700a, the stack is encased in a metallic casing 715. The casing 715 is preferably made of a high conductivity metal such as titanium, copper, tin, nickel, silver, aluminum, TiW (90/10, and other alloys), copper tin alloys, and alloys of the above metals). The casing extends around and encloses the pyrolytic graphite stack so that the pyrolytic graphite stack is embedded within the casing. In one embodiment, the casing is hermetic, so that no external agents can penetrate to contact the stack. The casing may be applied by metallic deposition techniques or formed by mechanically manipulating workable forms of the aforementioned metals to encase the stack 700a.

The embodiment of FIG. 7C may be created by: (1) forming a selected number of the graphite layers to be formed into the stack into a suitable shape to be applied to the frame element; (2) providing the graphite layers and the coating material in a vacuum environment; (3) stacking successive graphite layers into a stack 700b; (4) applying uniform pressure to the graphite layers; and encasing the graphite layers in the stack using one of (a) metallic deposition onto the stack or (b) mechanical manipulation of metal plates of sufficient size to surround the stack followed by sealing the casing about the stack 700b.

Suitable graphite layers include any of the pyrolytic graphite materials discussed herein. The graphite material used in the stack should have its high plane of conductivity arranged and oriented perpendicular to the plane of the drawings of FIGS. 7C and 7D so that when arranged in the device 2, high-conductivity plane lies parallel to the direction of heat transfer (away from the active circuitry 136 and toward the ends of temples 102).

FIG. 7A is a top view of the HMD device to a illustrating that the encased graphite layer stack structure can be incorporated into the frame materials of the device. Corporation the frame materials is also illustrated with respect to device two in FIG. 8. In this embodiment, the case stack, illustrated in Figures of be, is molded into the frame itself. FIGS. 7E and 7F illustrate positioning of the encased structure on a top portion of the device 2a.

Various configurations of the encased graphite layer stack structure can be utilized in accordance with the teachings of this technology. The structure may have various different three-dimensional forms, an alternative components of the forms may be joined together. As illustrated in FIG. 7D, two such structures may be formed in a linear manner and joined together using any of the aforementioned techniques of adhesive, creating the structures from native graphite sheets, or the like.

With respect to FIGS. 7A and 7C, each encased structure may have a length L, width W and height H defined in accordance with the thermal management objectives of the system. Each of the respective sheets of graphite in the layer stack may be defined and selected to have a plane high thermal conductivity along a first axis and a plane of lower thermal conductivity along a second axis. In one embodiment the plane is selected so that the axis of high conductivity aligns with the length and is parallel to an axis bisecting the length of the encased stack. As noted in FIG. 7A, the length is multiple times longer than the width the height less than the width.

FIGS. 7E and 7F illustrate the encased structure 752 positioned on an exterior surface of an HMD 2a. In the illustration of FIGS. 7E and 7F, the encased structure 752 is positioned on a top surface 910 of arm 102r1. It should be understood that the structure 752 may be provided on a bottom surface 912 or a side surface 914 of the arm. In addition, FIG. 7E illustrates two encased structures 752 joined at an interface 753. Due to the workability of the metal encasing the structure 752, joining of respective structures may occur by thermal bonding such as mechanically connecting, soldering or welding the respective structures 752, or by forming the underlying graphite layers in to an angled structure and thereafter encasing the formed angled structure in a metal coating.

It will be understood that the application of a graphite layer stack may be utilized in combination with the nanocarbon infused frame elements discussed above. In addition, the encased structure may be utilized with the stack 600 described above, alone or in combination therewith.

Buttressed Frame Structure

FIGS. 9-11 illustrate an alternative frame structure suitable for use with any of the aforementioned devices 2 and 2a. Although the subject matter will be illustrated with respect to the HMD 2a, it will be recognized that similar techniques can be used with any type of framing structure.

In FIGS. 9-11B, temples 102R1 and 102L1 have been formed to include voids 900, 902, thereby creating arches adjacent the joining points of the temples 102r1 and 101L1 to temples 102R2 and 102L2, respectively, and housing 131. The voids effectively provide a arched temple structure which couples the housing 131 two other portions of the side arms 102L2/102r2. Voids 900, 902 provide an increase in the surface area available for convective and radiant heat transmission to the ambient environment. Any heat provided and transferred from the active circuitry to the temples 102 R1 and 102/1 can be more easily cooled by the ambient environment. In the illustrated embodiment, void 900 includes a first sidewall 912, second sidewall 914 and two arches 916, 918 joining the respective sidewalls In addition, the voids 900, 902 increase the strength of the temples 102 by using arch construction techniques. An arch is a pure compression form resolving forces into compressive stresses and, in turn eliminating tensile stresses. Given the architecture of HMDs 2/2a, with forward components carrying most of the weight and support components (such as the temples 102) stabilizing the device, strength in the temple components in combination with lightweight constructions is desirable.

Although the voids are illustrated as being provided only in elements 102r1 and 102/1, it will be understood that the voids may be formed in temple portions 102R2 and 102L2, or in a unitary temple structure such as that provided in the HMD device 2.

In addition, the void architecture of FIGS. 9 and 10A can be utilized with any of the aforementioned thermal management techniques described above.

In particular, the components of the device of FIG. 9 may be manufactured of nanocarbon infused materials as described above. Any one or more of the graphite structures discussed above may be attached on the surface of or embedded in the structures of FIG. 9.

FIG. 10A illustrates an example of using a graphite layers to that described above in FIG. 5A in combination with the voids 900, 902. As illustrated therein, a graphite layer 404 is provided as in FIG. 5A with portions 404r and 404l being attached to elements 102r1 and 102/1 having voids therein. Graphite layers 404r and 404l may be a sheet of pyrolytic graphite, any of the graphite stacks illustrated herein, or a laminated layer of graphene.

Figure 11A:
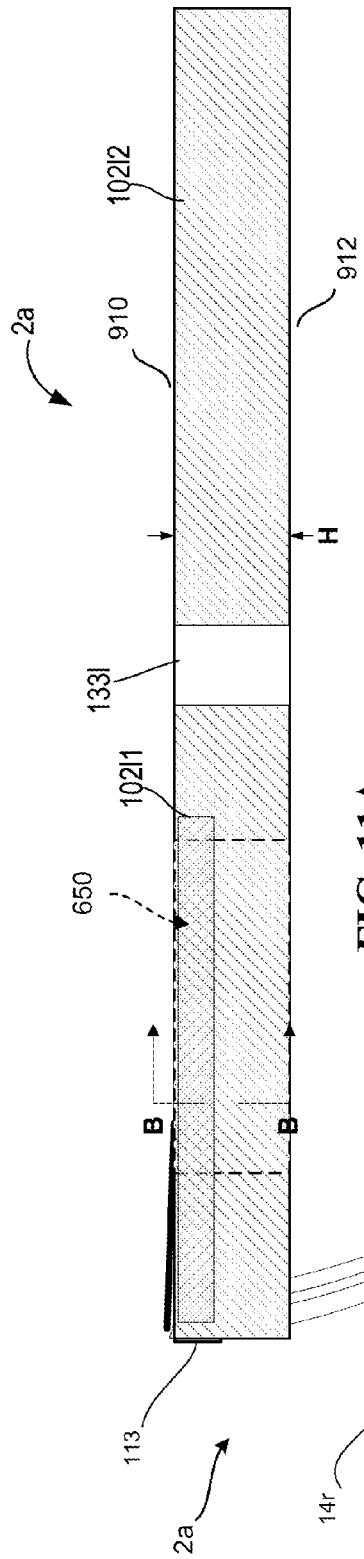
FIG. 11A is a side view of the thermal management solution of FIG. 9.
Figure 10B:
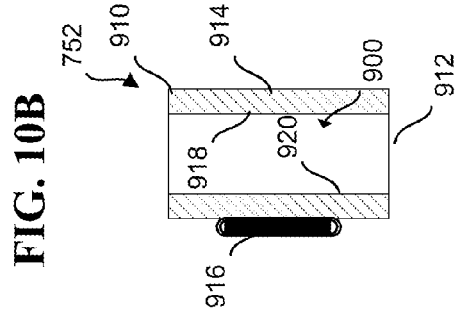
FIG. 10B is a cross-sectional view along line B-B in FIG. 10A
Figure 11B:
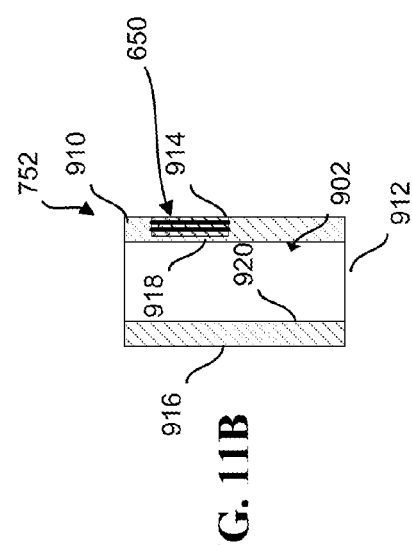
FIG. 11B is a cross-section along line B-B in FIG. 11A.

FIG. 10B illustrates a cross-section along line B-B in FIG. 10A, showing the top surface 910, bottom surface 912, first side 914 and second side 916 of arm portion 102r1. In addition, the interior walls 918 and 912 are illustrated. It will further be appreciated that graphite layer or layers may be applied to the interior walls 918, 920 of the structure of FIG. 10A. In FIG. 10B, only void 900 is illustrated, but it should be understood that structure 752 can be provided on both arms 102L and 102r FIGS. 11A and 11B illustrate the use of the graphite layer structure 650 described above wherein the structure 650 is encased in the frame 2a. The structure 650 is thermally coupled to the heat producing components and extends into the void regions 900, 902 (In FIGS. 11A and 11B, only void 902 is illustrated, but it should be understood that structure 650 can be provided on both arms 102l and 102r.)

In addition, the voids formed in components of the frame may take various shapes. The arcuate voids 900, 902 provide convection vertically when the device is worn by a wearer. This can provide convection with cooler air passing through and around the voids and frame element as it rises. However, the voids may be provided horizontally with respect to direction of the temples 102. Moreover, the voids may be provided in any number and shape. For example, a plurality of circular or other shaped bores may be provided in the frame elements Additional graphite layers may be provided on the interior surfaces of voids 900, 902 or the outer surfaces of the temples 102.

Any one or more of the graphite layers, graphite stacks or encased structures may be embedded in the frame by manufacturing the frame components around the thermal structures. An injection molding process embedding such structures includes steps of: (1) providing an injection molding apparatus; (2) mixing the engineering polymer pellets or powder comprising the frame material and carbon nanosphere particles uniformly; (3) obtaining the mixture from step (2) and adding the mixture to the injection molding apparatus including a heating cylinder; (4) melting the mixture at high temperature; (5) providing the graphite layer, multilayer stack or encased graphite layer stack into a mold cavity and closing the cavity; (6) injecting the molten mixture through an injection nozzle into a closed mold cavity; and (7) cooling the molten mixture in a mold to solidify the desired part. An extrusion process includes (1) providing a extrusion molding device; (2) mixing the engineering polymer pellets or powder comprising the frame material and carbon nanosphere particles uniformly; (3) obtaining the mixture; (4) melting the mixture at high temperature; (4) forming a molten mixture through a die to surround a graphite layer, multilayer stack or encased graphite layer stack; and (5) cooling the molten mixture in a mold to solidify the desired part.

Aspects of Certain Embodiments

Embodiments of the technology include a multilayer stack of graphite sheets, each sheet having a plane high thermal conductivity oriented along a first axis and a plane of lower thermal conductivity along a second axis different from the first axis, the stack having a three-dimensional shape including a length and a width where the length is longer than the width and the first axis aligns parallel to said length, the multilayer stack having a height less than the width; and a plurality of bonding layers interspersed between each sheet of the multilayer stack, each bonding layer thermally coupling each sheet to a respective adjacent sheet.

Embodiments of the technology may further include any of the aforementioned embodiments wherein the stack is comprised of a plurality of sheets of pyrolytic graphite.

Embodiments of the technology may further include any of the aforementioned embodiments wherein an outer layer of the stack is bonded to a structure, the structure including heat producing components provided in a frame, the stack thermally coupled to at least one of the heat producing components.

Embodiments of the technology may further include any of the aforementioned embodiments wherein the frame includes an arm extending in a direction away from the heat producing components, and the multilayer stack is bonded to the arm.

Embodiments of the technology may further include any of the aforementioned embodiments wherein the multilayer stack is embedded in a material formed into the frame.

Embodiments of the technology may further include any of the aforementioned embodiments wherein the length is defined by a first end and a second end, the first end coupled to the heat producing components, the second end extending away from the heat producing components and bonded to an exterior surface of the structure.

Embodiments of the technology may further include any of the aforementioned embodiments wherein stack comprises a plurality of graphite sheets, each sheet bonded to a respective sheet using a metal.

Embodiments of the technology may further include any of the aforementioned embodiments wherein stack comprises a plurality of graphite sheets, each sheet bonded to a respective sheet using an adhesive.

Embodiments of the technology may further include any of the aforementioned embodiments implemented in a wearable device including electronic components. Such embodiments may include a mounting structure including the electronic components; and a stack of graphite layers and thermally coupled to the electronic components, each layer having a plane of high thermal conductivity oriented along a first axis and a lower thermal conductivity oriented along a second axis, the stack having a three-dimensional shape including a length and a width where the length is longer than the width and the first axis is parallel to said length, the stack having a height less than the width, an outer layer of the stack bonded to an exterior surface of the mounting structure such the length extends away from the electronic components.

Embodiments of the technology may further include any of the aforementioned embodiments wherein the stack is comprised of a plurality of sheets of pyrolytic graphite.

Embodiments of the technology may further include any of the aforementioned embodiments wherein the structure includes an arm extending in a direction away from the electronic components, and the stack is bonded to the arm.

Embodiments of the technology may further include any of the aforementioned embodiments wherein stack comprises a plurality of graphite sheets, each sheet bonded to a respective sheet using a metal.

Embodiments of the technology may further include any of the aforementioned embodiments wherein stack comprises a plurality of graphite sheets, each sheet bonded to a respective sheet using an adhesive.

Embodiments of the technology may further include any of the aforementioned embodiments wherein the mounting structure is comprised of a material including a plurality of carbon nanoparticles.

Embodiments of the technology may further include any of the aforementioned embodiments in a head mounted display including heat producing electrical components operating a display optical system. Such embodiments include: an optical mounting structure including the heat producing electrical components, the mounting structure housing the display optical system coupled to the heat producing electrical components, and first and second temple arms extending away from the heat producing electrical components and the display optical systems, the temple arms adapted to secure the mounting structure to the head of a wearer; and a bonded stack of graphite layers, the stack thermally bonded to at least the heat producing electrical components and the optical mounting structure, each layer having a plane high thermal conductivity along a first axis and a lower thermal conductivity along a second axis, the stack having a three-dimensional shape including a length and a width where the length is longer than the width and the first axis aligns parallel to said length, the stack having a height less than the width.

Embodiments of the technology may further include any of the aforementioned embodiments wherein the stack is comprised of a plurality of sheets of pyrolytic graphite.

Embodiments of the technology may further include any of the aforementioned embodiments wherein the bonded stack is embedded in a material formed into the structure.

Embodiments of the technology may further include any of the aforementioned embodiments wherein the length is defined by a first end and a second end, the first end coupled to the heat producing components, the second end extending away from the heat producing components and bonded to an exterior surface of the structure.

Embodiments of the technology may further include any of the aforementioned embodiments wherein stack comprises a plurality of graphite sheets, each sheet bonded to a respective sheet using a metal.

Embodiments of the technology may further include any of the aforementioned embodiments wherein stack comprises a plurality of graphite sheets, each sheet bonded to a respective sheet using an adhesive.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts that would be recognized by one skilled in the art are intended to be within the scope of the claims.

What is claimed is:

1. An apparatus comprising:
a wearable device, including:
electronic components;
a mounting structure including the electronic components; and
a stack of graphite layers thermally coupled to the electronic components, each of the layers having a plane of high thermal conductivity oriented along a first axis and a lower thermal conductivity oriented along a second axis, the stack having a three-dimensional shape including a length and a width where the length is longer than the width and the first axis is parallel to said length, the stack having a height less than the width, an outer layer of the stack of graphite layers bounded to an exterior surface of the mounting structure such that the length extends away from the electronic components.

2. The apparatus of claim 1 wherein the stack of graphite layers is comprised of a plurality of sheets of pyrolytic graphite.

3. The apparatus of claim 2 wherein the mounting structure includes an arm extending in a direction away from the electronic components, and the stack is bonded to the arm.

4. The apparatus of claim 3 wherein the stack of graphite layers comprises a plurality of graphite sheets and a plurality of bonding layers interspersed between the graphite sheets, each one of the bonding layers comprising a metal.

5. The apparatus of claim 3 wherein the stack of graphite layers comprises a plurality of graphite sheets and a plurality of bonding layers interspersed between the graphite sheets, each one of the bonding layers comprising an adhesive.

6. The apparatus of claim 3 wherein the mounting structure is comprised of a material including a plurality of carbon nanoparticles.

7. A head mounted display including heat producing electrical components operating a display optical system, comprising:
an optical mounting structure including the heat producing electrical components, the optical mounting structure housing the display optical system coupled to the heat producing electrical components, and first and second temple arms extending away from the heat producing electrical components and the display optical system, the temple arms adapted to secure the optical mounting structure to a head of a wearer; and
a bonded stack of graphite layers, the stack thermally bonded to at least the heat producing electrical components and the optical mounting structure, each of the graphite layers having a plane high thermal conductivity along a first axis and a lower thermal conductivity along a second axis, the stack having a three-dimensional shape including a length and a width where the length is longer than the width and the first axis aligns parallel to said length, the stack having a height less than the width.

8. The display of claim 7 wherein the bonded stack of graphite layers is comprised of a plurality of sheets of pyrolytic graphite.

9. The display of claim 8 wherein the bonded stack is embedded in a material formed into the optical mounting structure.

10. The display of claim 8 wherein the length is defined by a first end and a second end, the first end coupled to the heat producing electrical components, the second end extending away from the heat producing components and bonded to an exterior surface of the optical mounting structure.

11. The display of claim 8 wherein the stack of graphite layers comprises a plurality of graphite sheets and a plurality of bonding layers interspersed between the graphite sheets, each one of the bonding layers comprising a metal.

12. The display of claim 8 wherein the stack of graphite layers comprises a plurality of graphite sheets and a plurality of bonding layers interspersed between the graphite sheets, each one of the bonding layers comprising an adhesive.

* * * * *